United States Patent
Pengelly et al.

(10) Patent No.: US 7,193,473 B2
(45) Date of Patent: Mar. 20, 2007

(54) HIGH POWER DOHERTY AMPLIFIER USING MULTI-STAGE MODULES

(75) Inventors: Raymond S. Pengelly, Hillsborough, NC (US); E. James Crescenzi, Cambria, CA (US); Simon M. Wood, Sunnyvale, CA (US); Tom Stewart Dekker, Durham, NC (US)

(73) Assignee: Cree, Inc., Durham, NC (US)

( * ) Notice: Subject to any disclaimer, the term of this patent is extended or adjusted under 35 U.S.C. 154(b) by 111 days.

(21) Appl. No.: 11/090,577

(22) Filed: Mar. 24, 2005

(65) Prior Publication Data

US 2006/0214732 A1 Sep. 28, 2006

(51) Int. Cl.
*H03F 3/68* (2006.01)

(52) U.S. Cl. .................. 330/295; 330/124 R; 330/149

(58) Field of Classification Search ............... 330/295, 330/124 R, 149, 286
See application file for complete search history.

(56) References Cited

U.S. PATENT DOCUMENTS

| | | | |
|---|---|---|---|
| 5,786,727 A * | 7/1998 | Sigmon ................. 330/124 R |
| 6,320,462 B1 * | 11/2001 | Alley ..................... 330/124 R |
| 6,700,444 B2 | 3/2004 | Pengelly |
| 6,737,922 B2 | 5/2004 | Pengelly et al. |
| 6,791,417 B2 | 9/2004 | Pengelly et al. |
| 6,798,295 B2 | 9/2004 | Pengelly et al. |
| 6,864,742 B2 * | 3/2005 | Kobayashi ............. 330/124 R |
| 6,947,711 B1 * | 9/2005 | Leyonhjelm ............ 455/114.3 |
| 7,061,314 B2 * | 6/2006 | Kwon et al. ........... 330/124 R |
| 2006/0114064 A1 * | 6/2006 | Shiikuma .................... 330/295 |

OTHER PUBLICATIONS

Crescenzi et al., "30 Watt Surface-Mount Power Amplifiers for PCS and UMTS Applications," 2003 Radio and Wireless Conference (RA WCON), Digest Paper W4.1 pp. 393-396.
Wood et al., "A High Power, High Efficiency UMTS Amplifier using a Novel Doherty Configuration," RA WCON 2003, Digest Paper P2.20 pp. 329-333.

* cited by examiner

*Primary Examiner*—Patricia Nguyen
(74) *Attorney, Agent, or Firm*—Beyer Weaver LLP

(57) ABSTRACT

A high power Doherty RF amplifier utilizes multi-stage amplifier modules for both the main amplifier and the peak amplifiers. In one embodiment of a two way two stage amplifier, the first stage of each amplifier module can include signal pre-distortion whereby the first stage compensates for distortion in both the first and second stages. The design is simple and results in a high efficiency amplifier with high gain. In one embodiment, a commercially available CREE PFM19030SM power module is used in both the main amplifier and the peak amplifier.

11 Claims, 10 Drawing Sheets

HIGH POWER DOHERTY AMPLIFIER USING MULTI-STAGE MODULES

CROSS REFERENCE TO RELATED APPLICATIONS

This invention is related to U.S. Pat. Nos. 6,700,444; 6,737,922; 6,791,417; and 6,798,295, assigned to Cree Microwave, Inc.

Filed herewith and incorporated by reference for all purposes are a specification sheet for CREE PFM19030 amplifier, a specification sheet for a Doherty amplifier employing the PFM19030 amplifier module, and a paper titled "60 Watt Doherty Amplifiers Using High Gain 2-Stage Hybrid Amplifier Modules."

BACKGROUND OF THE INVENTION

This invention relates generally to RF power amplifiers, and more particularly the invention relates to a high power amplifier having improved efficiency and linearity using multiple stage modules.

Power amplifiers in basestations often operate at output power levels much lower than peak power. Unfortunately, the back-off power level reduces the efficiency of the power amplifier in the transmitter. In a conventional amplifier there is a direct relationship between efficiency and the input drive level. Therefore, high efficiency (DC to RF conversion efficiency) is not obtained until the RF input power level becomes sufficiently high to drive the amplifier into compression or saturation. Since in multicarrier communication systems an amplifier must remain as linear as possible, this region of high efficiency cannot be used.

A power amplifier circuit design which provides improved efficiency in back-off power levels is the Doherty amplifier circuit, which combines power from a main amplifier and from a peak amplifier. See, W. H. Doherty, "A New High-Efficiency Power Amplifier for Modulated Waves," Proc. IRE Vol. 24, No. 9, pp. 1163–1182, 1936. In the conventional Doherty configuration, the main or carrier amplifier 10 and peak amplifier 12 are designed to deliver maximum power with optimum efficiency to a load R, as shown in FIG. 1A. The main or carrier amplifier is a normal Class B amplifier, while the peak amplifier is designed to only amplify signals which exceed some minimum threshold. For an LDMOS power transistor, this can be accomplished by DC biasing the transistor below its pinch-off voltage for operation similar to Class C. The outputs of the two amplifiers are connected by a quarter-wave transmission line of characteristic impedance R, and a load of one-half of the optimum load R is attached to the output of the peak amplifier. The RF input power is divided equally with a quarter-wave delay at the input to the peak amplifier, thus assuring that the output power of the two amplifiers at the load R/2 will be in phase.

Heretofore, the Doherty amplifier has employed discrete single stage amplifiers in the carrier and peak amplifier modules. The present invention realizes advantages not available when using discrete single stage amplifiers.

SUMMARY OF THE INVENTION

In accordance with the invention, multi-stage amplifier modules are employed in a Doherty amplifier for both the main amplifier and the peak amplifier or peak amplifiers.

In one embodiment of a two-way two stage amplifier, the first stage of each amplifier module can include signal pre-distortion whereby the first stage compensates for distortion in both of the first and second stages. The design is simple and the results in a high efficiency amplifier with high gain.

The invention and objects and features thereof will be more readily apparent from the following detailed description and appended claims when taken with the drawings.

DETAILED DESCRIPTION OF THE PREFERRED EMBODIMENTS

The present invention provides a high power Doherty amplifier with improved gain and linearity compared to conventional single stage Doherty amplifiers employing discrete transistors. In the present invention, a Doherty amplifier having a main or carrier amplifier and one or more peak amplifiers employs multi-stage amplifier units which can be manufactured in hybrid assemblies.

Figure 1:
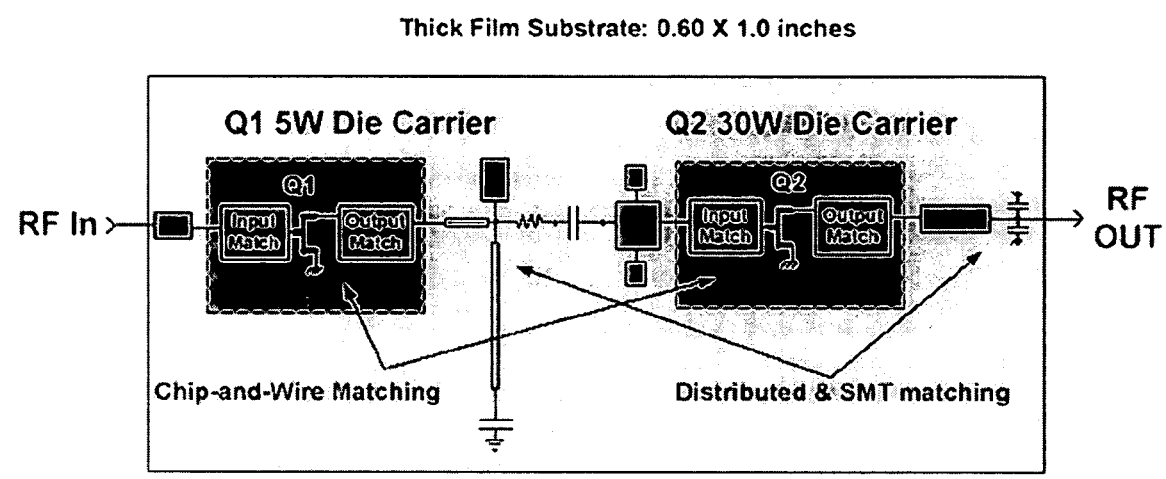
FIG. 1 is a functional block diagram of a prior art two stage hybrid amplifier module which can be used in an embodiment of the invention.

FIG. 1 is a functional block diagram of a commercially available two stage thick film hybrid microelectronic amplifier (CREE PFM19030SM) which can advantageously be employed in a Doherty amplifier in accordance with an embodiment of the present invention. The first stage of the module includes a field effect transistor Q1 connected to a RF input through input matching circuitry and pre-distortion circuitry. The output of transistor Q1 is applied through an output matching network through distributed surface mount technology matching circuitry to the second stage including a second field effect transistor Q2. Transistor Q2 is connected to receive the output of Q1 through input matching circuitry and applies an amplified output through output matching circuitry to the RF output.

The partitioning of this circuit places the devices with high power dissipation on metal interposers that constitute RF ground and also function as heat spreaders; while matching circuitry and bias injection and bypassing is realized using thick film microstrip circuits including SMT passive elements. The block diagram in FIG. 1 demonstrates the amplifier partitioning.

Q1 and Q2 are LDMOS transistors, and each LDMOS transistor die exhibits input or output impedances on the order of 1–5 ohms (before adding chip and-wire matching). The combination of chip-and-wire matching and distributed circuit matching on the output of the 30 W transistor (Q2) transforms the optimum power-match impedance (for Class AB operation) to a nominal 20 Ohm level. This simplifies the off-module matching circuitry required for a Doherty amplifier subsystem.

Each amplifier module assembly includes the two (5 W and 30 W) die carriers soldered to a bottom plate of copper (1.0 mm thick). The silicon LDMOS transistor die (manufactured by Cree Microwave) are eutectically attached to metal interposers. The bottom plate also supports a 0.5 mm thick single-layer alumina thick-film substrate which has cutouts where the die carriers are located. The alumina substrate is attached to the copper base with a conductive epoxy. The heat from the die is spread through the die carrier (interposer) and then through the thick copper base, before it encounters the external interface.

When mounted on a PCB layout, the two-stage surface-mount module occupies only slightly more board space than would a single discrete-package 30 W transistor (with conventional bolt-down metal flange). In addition to the RF input and RF output leads, there are leads accessing the first-stage drain and internal temperature compensation circuitry. Bypass circuits are included internal to the module to support wide video bandwidths and thereby minimize memory effects.

Figure 2:
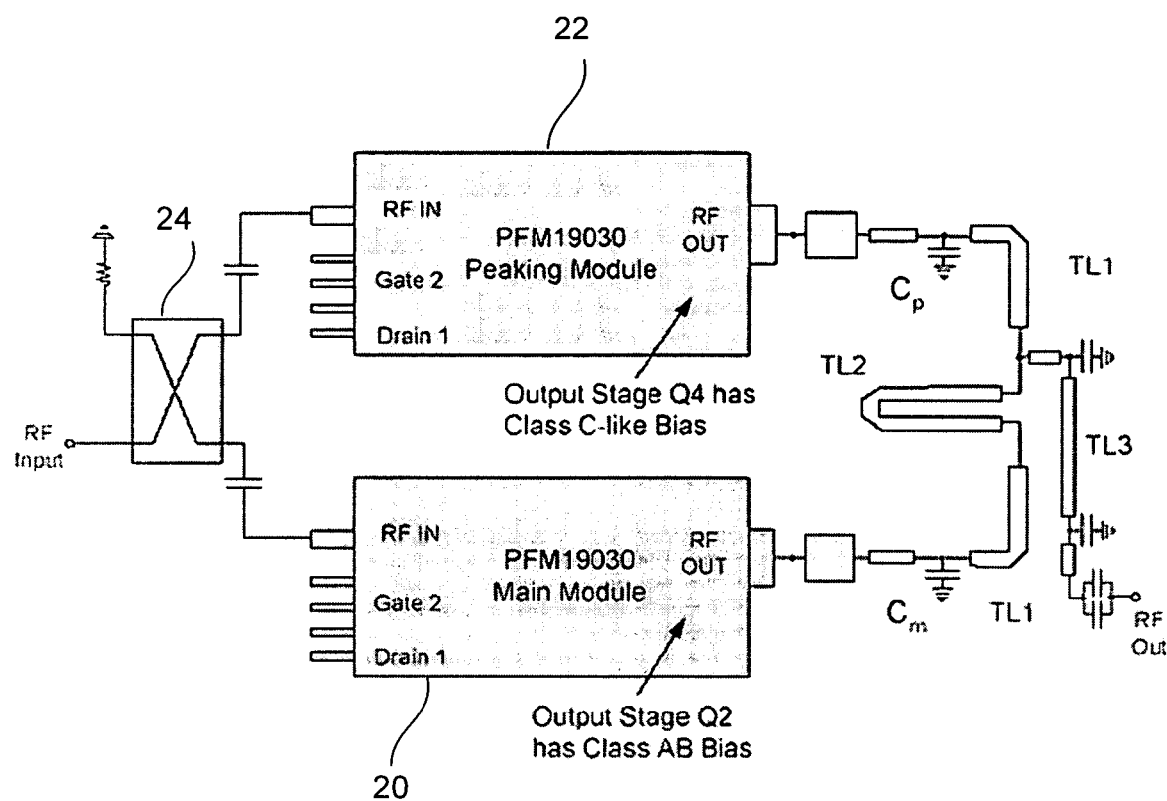
FIG. 2 is a functional block diagram of a 2-way two stage RF power amplifier employing hybrid amplifier modules of FIG. 1.

FIG. 2 is a functional block diagram of a 2-way two stage Doherty amplifier in accordance with an embodiment of the present invention which employs two PFM19030SM modules of FIG. 1. As shown in FIG. 2, the amplifier includes a main module 20 and a peaking module 22 which receive an RF input signal through splitter 24. The main module 20 is biased for class AB operation, and the peak amplifier module is biased nominally for class C operation.

Module inputs are connected directly to a 3 dB quadrature hybrid. The outputs are matched using short low impedance transmission line elements and shunt capacitors Cp and Cm. Because the output impedances of the modules are much higher than unmatched discrete LDMOS transistors, the additional matching circuitry is minimized. Cp and Cm are of different values (Cp<<Cm) as is appropriate for the different operating modes (Class C vs. Class AB) of the 30 W devices.

Further impedance transformation is accomplished using transmission lines TL1 (each side). The main module side TL2 section is nominally 90°, as is typical of classic 2-Way Doherty designs. The output section TL3 and associated capacitors constitute an impedance transformer. All element (transmission line and shunt capacitor) values are adjusted in the circuit analysis and optimization process. The validity and applications power of the CMC device models was confirmed by the experience that only capacitor values were adjusted in prototype circuitry to obtain reported results (transmission line lengths and widths were left at turn-on values).

The capacitor values are adjusted primarily to achieve optimum peak power levels. Bias conditions are the most sensitive determinate of amplifier linearity and efficiency. By choosing Class AB & Class C, circuit linearity is optimized at some tradeoff in efficiency. Linearity is critical to the intended applications, in which further correction by pre-distortion can be anticipated. A major objective is to achieve system-level linearity standards with pre-distortion only (avoiding feed-forward losses). This strategy can potentially maximize system efficiency and reduce complexity.

Figure 3:
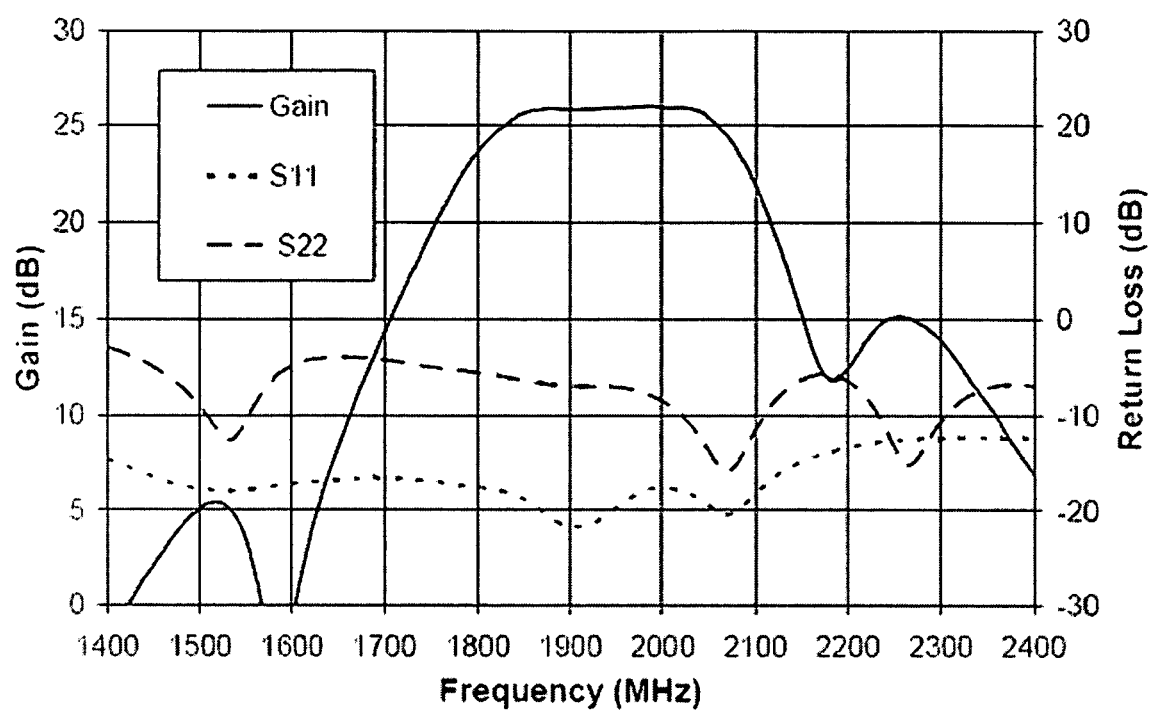
FIG. 3 is a plot of amplifier gain and input and output return loss versus frequency for one embodiment of the invention.
Figure 4:
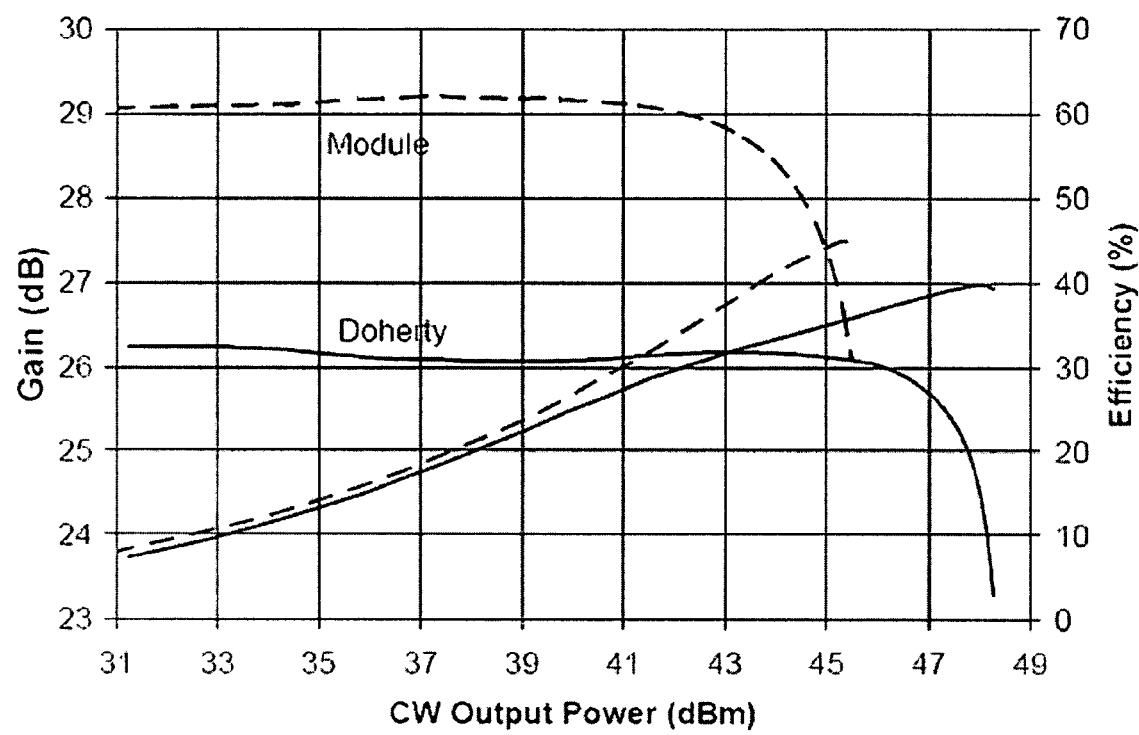
FIG. 4 is a graph illustrating Doherty amplifier and individual class AB module gain and efficiency versus CW power output.

Gain and return loss for the two way, two stage amplifier of FIG. 2 are presented in FIG. 3. Gain is 26±0.2 dB over 1930–1960 MHz. Measured gain and efficiency versus CW output power are compared for the Doherty amplifier and an individual module operated with normal Class AB bias in FIG. 4. The Class AB module has a peak output capability on nominally 30 Watts (+44.8 dam), whereas the Doherty output is nominally 60 Watts (47.8 dam). Note that both circuits have device quiescent bias levels adjusted for optimum linearity, not for optimum peak power or for efficiency. The comparison of the shape of the efficiency versus output power characteristics is of particular interest. Even though the Doherty amplifier has twice the output power capability, its efficiency is similar to that of the individual module at low power levels.

Figure 5:
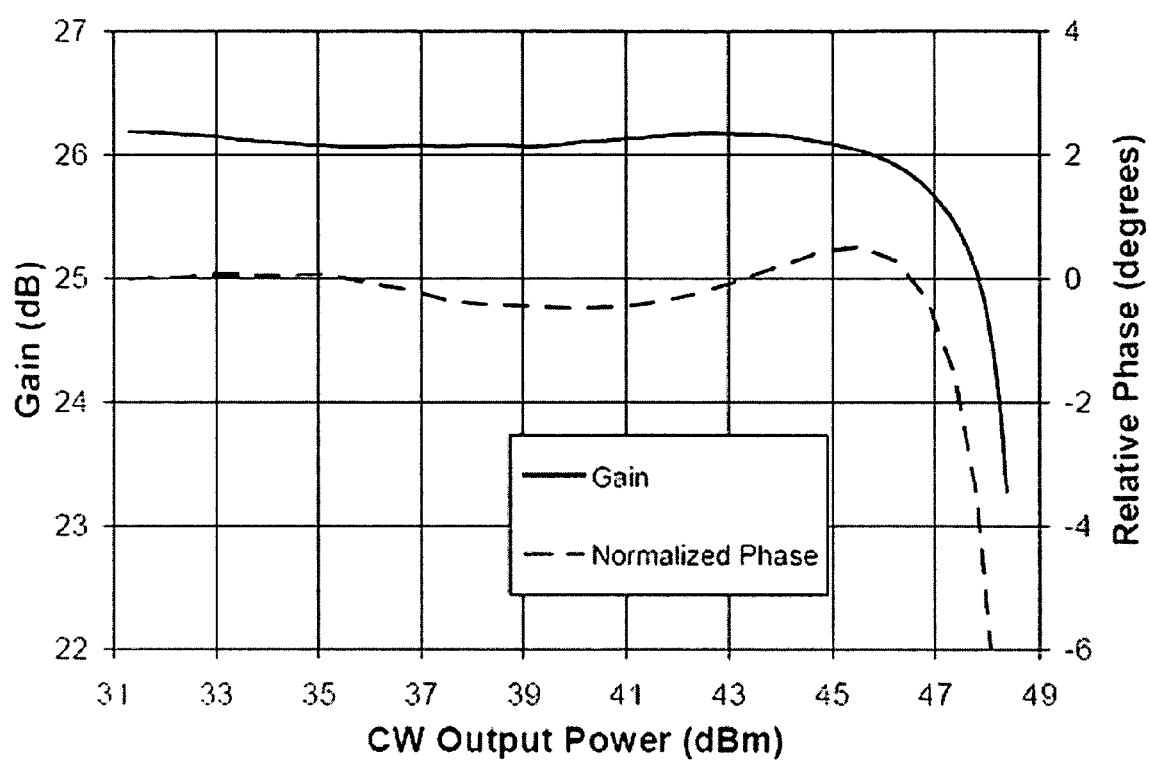
FIG. 5 is a graph of Doherty amplifier gain and AM/PM versus CW power out.
Figure 6:
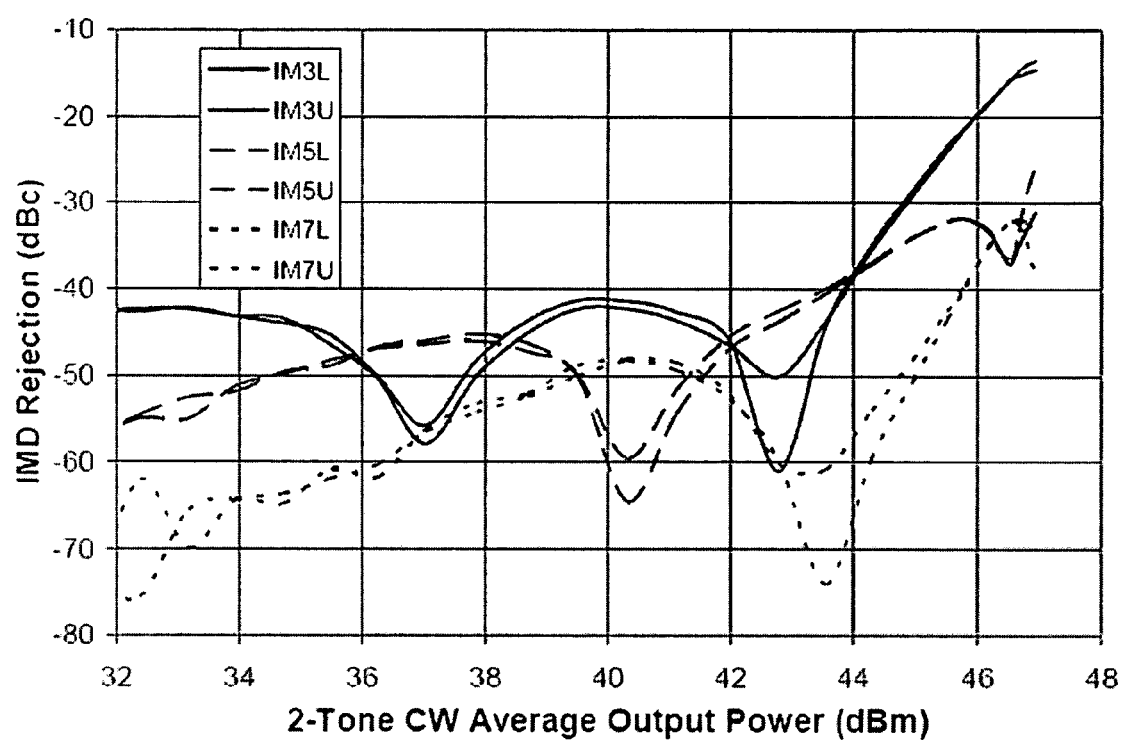
FIG. 6 is a graph illustrating Doherty 2-Tone CW intermodulation products versus average output power.

FIG. 5 presents measured gain and relative phase versus output power (AM/PM) for the Doherty amplifier. The very low AM/PM contributes to 2-tone CW and WCDMA linearity.

Figure 7:
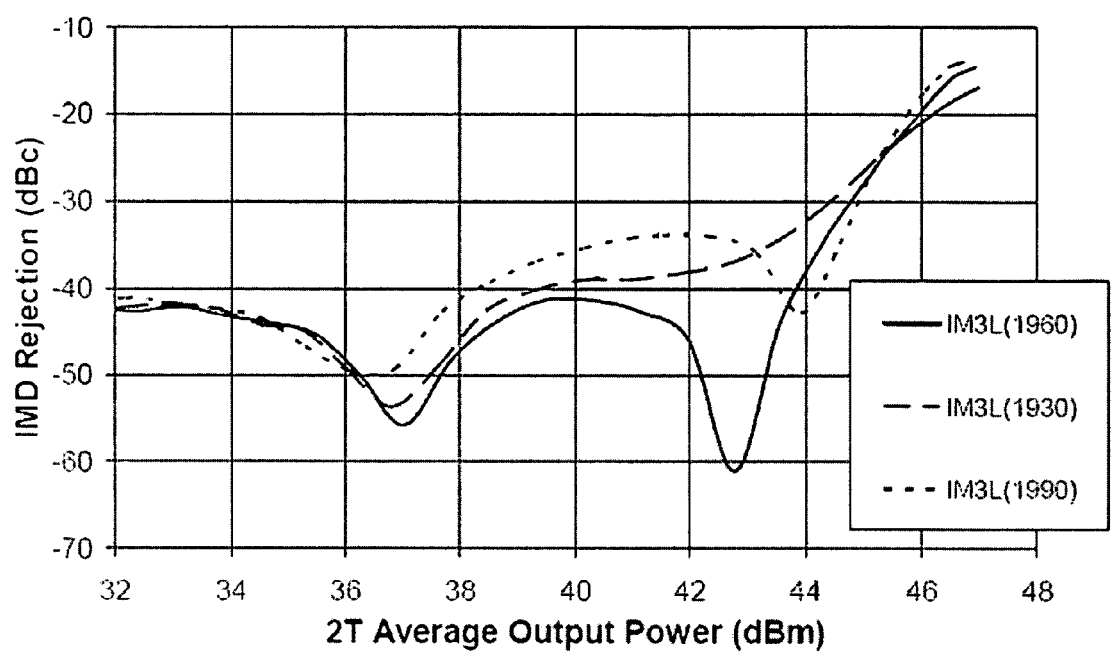
FIG. 7 is a graph illustrating Doherty amplifier intermodulation products versus average power out at three frequencies.

A characteristic of this 2-Way Doherty amplifier is the degradation of linearity as one deviates from the band center frequency. This is thought to be typical of 2-Way Doherty amplifiers in general. Center-band and band-edge measurements of CW 2-Tone 3rd order IMD products are included in FIG. 7. The 2-tone CW Imps show more dependence with frequency than do the 2-WCDMA signal tests.

Figure 8:
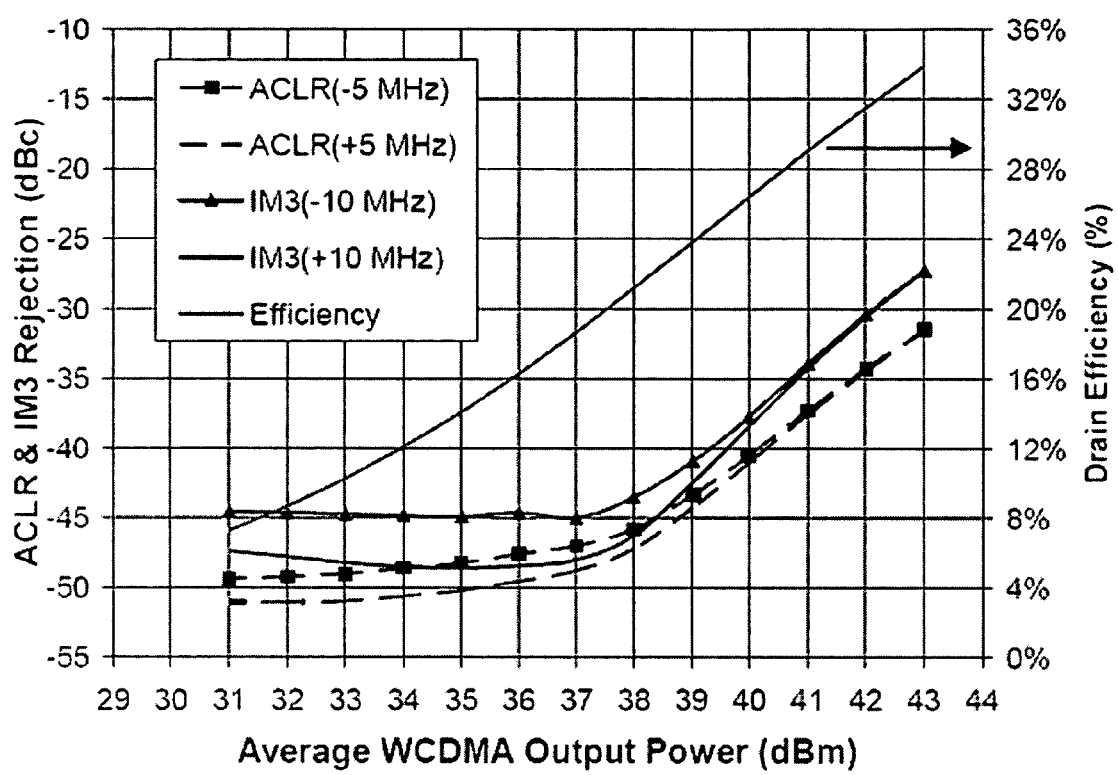
FIG. 8 is a plot of Doherty amplifier 2-WCMDMA signal ACLR and intermodulation rejection versus average power output.
Figure 9:
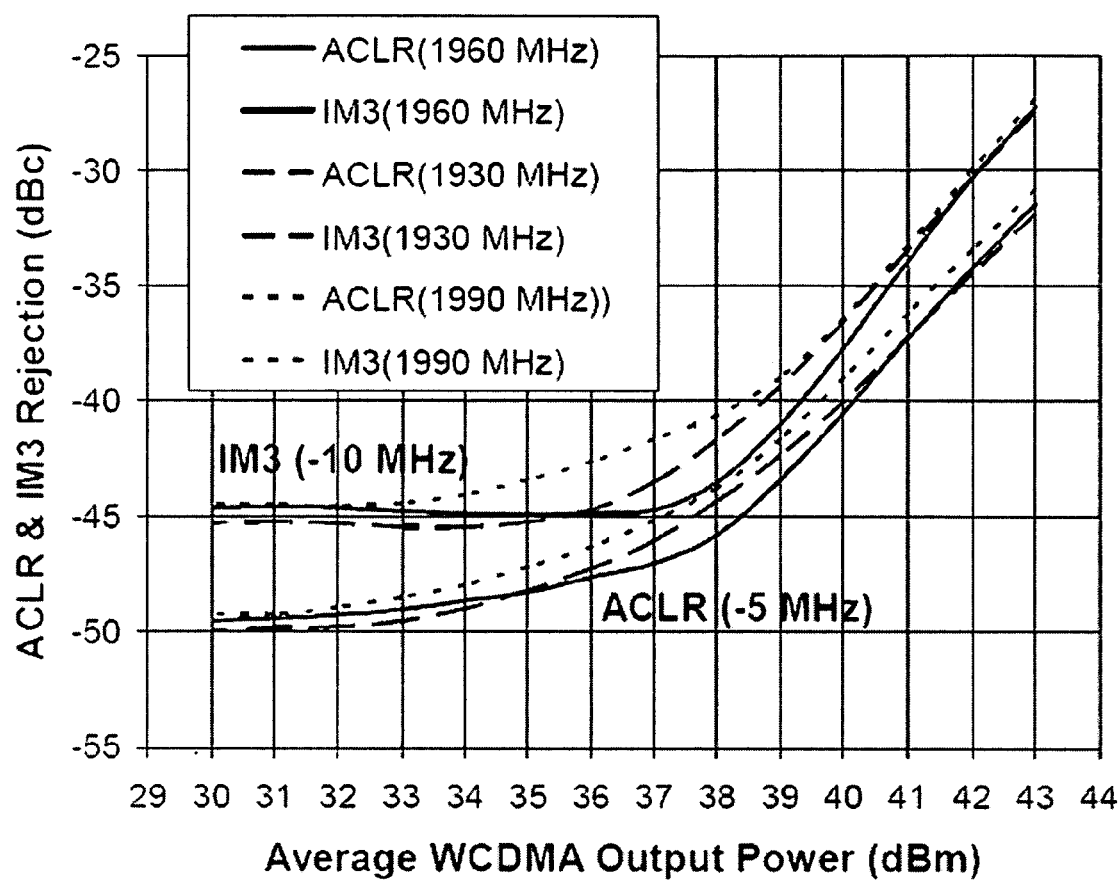
FIG. 9 is a graph of Doherty amplifier signal ACLR and IM3 rejection versus average power output for three frequencies.

Standard WCDMA testing involved two signals separated by 10 MHz (3GPP with 8.5 dB peak-to-average), centered at 1960 MHz. Measurements (FIG. 8) show that the IM3 products at 10 MHz offsets tend to be the dominant distortion, and a degree of IM3 asymmetry is evident at lower power levels (this also occurs for the individual modules operated in standard Class AB conditions). ACLR and IM3 rejection are plotted at three RF frequencies in FIG. 9. Measurement system dynamic range is limited to about −55 dab at low power(~−60 dab at higher power levels).

Figure 10:
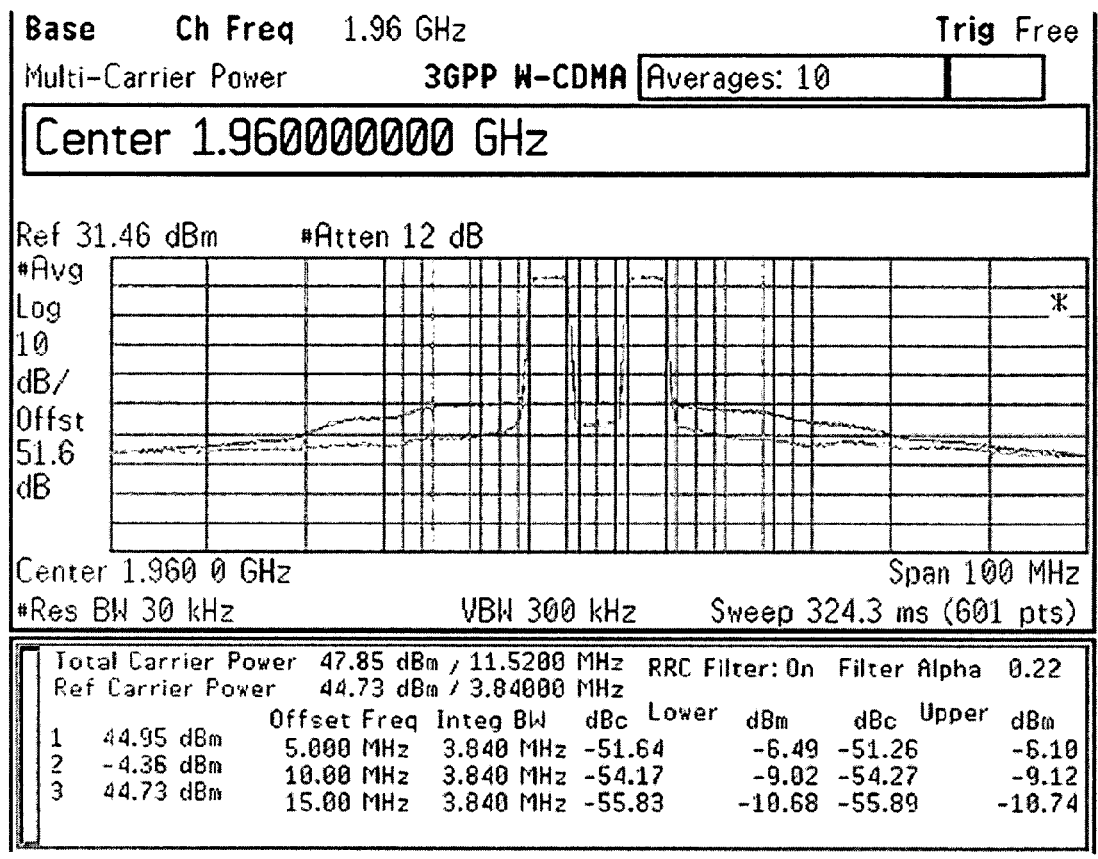
FIG. 10 is illustrates specifications for a Doherty amplifier with pre-distortion for a 12.5 watt 2WCDMA signal spectrum in accordance with an embodiment of the invention.

A key application objective is to further improve linearity by use of pre-distortion. FIG. 10 shows 2-WCDMA signal data using a PMC-Sierra Paladin 15 digital pre-distortion to enhance the Doherty amplifier linearity.

The signal in this case is two WCDMA signals with crestfactor reduction to 7.5 dB. Average output power is 12.5 Watts, and efficiency is 26.8%, with ACLR & IM3 at −51 & −54 dBc. Efficiency across the RF band varies from 28% to 26% (1930–1990), and ACLR is ≦−49 dBc and IM3 is ≦−50 dBc. IM3 asymmetry is very small after application of pre-D. This demonstrates excellent linearity and efficiency using this Doherty design in conjunction with pre-distortion.

The two-way two stage Doherty amplifier in FIG. 2 uses small surface-mount hybrid modules as the active elements in a 2-way 60 W Doherty amplifier. The design demonstrates good efficiency (26%) for two 3GPP WCDMA signals at 10 W average output, with ACLR of −40 dBc and IM3 of −38 dBc (uncorrected). When augmented by pre-distortion, 12.5 W of WCDMA is produced at 26% efficiency & ACLR/IM3 rejections of −49 dBc/−50 dBc across the full 1930–1990 MHz band. The associated 26 dB gain and low input return loss simplifies system design.

While the invention has been described with reference to a specific embodiment, the description is illustrative of the invention and is not to be construed as limiting the invention. For example, the transistors can be lateral DMOS silicon field effect transistors, MESFETs, HEMTs, HBTs, and bipolar transistors. Further, the invention has applicability to amplifiers having more than one peak amplifier and using modules with two or more stages. For example, a three way two stage amplifier using three CREE PFM19030 modules has been simulated for producing over 90 watts of single tone power with overall gain of 24 dB. Thus, various modifications and applications may occur to those skilled in the art without departing from the true spirit and scope of the invention as defined by the appended claims.

What is claimed is:

1. A high power RF amplifier comprising:
   a) a main amplifier including at least two stages of amplification, a first stage of the main amplifier including impedance matching and predistortion circuitry and an amplifier, and a second stage including impedance matching circuitry and an amplifier,
   b) at least one peak amplifier connected in parallel with the main amplifier, each peak amplifier including at least two stages of amplification, a first stage of the at least one peak amplifier including impedance matching and predistortion circuitry and an amplifier, and a second stage including impedance matching circuitry and an amplifier,
   c) a signal splitter for receiving and splitting an input signal for the main amplifier and the at least one peak amplifier,
   d) first impedance matching circuitry for coupling signals from the signal splitter to inputs to the main amplifier and to the at least one peak amplifier, and
   e) second impedance matching circuitry for coupling amplified signals from the main amplifier and from the at least one peak amplifier to common output, wherein the at least two stages of amplification in the main amplifier and in the at least one peak amplifier comprise serially connected transistors which are surface mounted on a substrate and are partitioned in a packaged thick-film hybrid microelectronic circuit.

2. The high power RF amplifier as defined by claim 1 wherein the main amplifier is biased for class AB operation and each peak amplifier is biased for class C operation.

3. The high power RF amplifier as defined by claim 1 wherein the first stage of amplification is 5 watts and a second stage of amplification is 30 watts.

4. The high power RF amplifier as defined by claim 3 wherein the RF amplifier comprises two way two stage with a total of 60 watts of power.

5. The high power RF amplifier as defined by claim 4 wherein the at least two stages of amplification comprise a CREE PFM19030SM power module.

6. The high power RE amplifier as defined by claim 1 wherein each of the main amplifier and peak amplifier comprises a transistor selected from the group consisting of lateral DMOS transistors, MESFETs, HEMTs, HBTs, and bipolar transistors.

7. The high power RF amplifier as defined by claim 1 wherein the at least two stages of amplification comprise a CREE PFM19030SM power module.

8. A RF power amplifier comprising:
   a) a main amplifier including two stages of amplification and biased for class AB operation, a first state of the main amplifier including impedance matching and predistortion circuitry and an amplifier, and a second stage including impedance matching circuitry and an amplifier,
   b) a peak amplifier including two stages of amplification and biased for class C operation, a first stage of the at least one peak amplifier including impedance matching and predistortion circuitry and an amplifier, and a second stage including impedance matching circuitry and an amplifier,
   c) a signal splitter for receiving and splitting an input signal for the main amplifier and for the peak amplifier,
   d) first impedance matching means for coupling signals from the signal splitter to inputs to the main amplifier and to the peak amplifier, and
   e) second impedance matching circuitry for coupling amplified signals from the main amplifier and the peak amplifier to common output, wherein the two stages of amplification in the main amplifier and in the peak amplifier comprise serially connected transistors which are surface mounted on a substrate and partitioned in a packaged thick-film hybrid microelectronic circuit.

9. The RF power amplifier as defined by claim 8 wherein the first stage of amplification is 5 watts and the second stage of amplification is 30 watts.

10. The RF power amplifier as defined claim 9 wherein two stages of amplification comprise a CREE PFM19030SM power module.

11. The RF power amplifier as defined by claim 8 wherein each of the main amplifier and the peak amplifier comprises a transistor selected from the group consisting of lateral DMOS transistor, MEFETs, HEMTs, HBTs, and bipolar transistors.

* * * * *

UNITED STATES PATENT AND TRADEMARK OFFICE
CERTIFICATE OF CORRECTION

PATENT NO. : 7,193,473 B2 Page 1 of 1
APPLICATION NO. : 11/090577
DATED : March 20, 2007
INVENTOR(S) : Pengelly et al.

It is certified that error appears in the above-identified patent and that said Letters Patent is hereby corrected as shown below:

On Title Page,

(75) Please correct Inventors name to read --E. James Crescenzi, Jr.--

Column 6,

Line 1: Please correct "RE" To read --RF--

Signed and Sealed this

Third Day of July, 2007

JON W. DUDAS
*Director of the United States Patent and Trademark Office*